United States Patent [19]

Lloyd

[11] Patent Number: 4,823,028

[45] Date of Patent: Apr. 18, 1989

[54] MULTILEVEL LOGIC CIRCUIT WITH FLOATING NODE VOLTAGE CLAMP

[75] Inventor: Randall B. Lloyd, Portland, Oreg.

[73] Assignee: Tektronix, Inc., Beaverton, Ohio

[21] Appl. No.: 129,106

[22] Filed: Dec. 4, 1987

[51] Int. Cl.[4] ............... H03K 19/086; H03K 19/092; H03K 19/003; H03K 17/16

[52] U.S. Cl. .................... 307/355; 307/455; 307/544; 307/558; 307/443; 307/358

[58] Field of Search ............ 307/454, 456, 443, 455, 307/467, 475, 355, 356, 471, 358, 360, 264, 272.1, 480, 542, 544, 547, 553, 555, 558–561, 564

[56] References Cited

U.S. PATENT DOCUMENTS

| | | | |
|---|---|---|---|
| 4,532,440 | 7/1985 | Barre | 307/455 |
| 4,560,888 | 12/1985 | Oida | 307/272 A |
| 4,647,799 | 3/1987 | Hsu et al. | 307/455 |
| 4,682,058 | 7/1987 | Gal | 307/473 |
| 4,686,394 | 8/1987 | Lam | 307/455 |
| 4,691,120 | 9/1987 | Kondo | 307/265 |
| 4,748,346 | 5/1988 | Emori | 307/270 |

FOREIGN PATENT DOCUMENTS 2518861  11/1975  Fed. Rep. of Germany ...... 307/455

Primary Examiner—Stanley D. Miller
Assistant Examiner—David R. Bertelson
Attorney, Agent, or Firm—William S. Lovell; Daniel J. Bedell

[57] ABSTRACT

A multilevel logic circuit includes a pair of resistors coupling collectors of an emitter-coupled pair of transistors to a voltage source, and includes a switch selectively connecting the emitters of the transistors to a current source. When the switch is closed, an input signal applied across the bases of the transistors controls an output signal produced between their collectors. When the switch is open, both transistors are off and the output signal is not affected by the input signal. A clamping circuit connected to a circuit node at the emitters of the transistors maintains a constant voltage at the node sufficient to prevent leakage current from charging or discharging inherent circuit capacitance at the node when the switch is open. Since the voltage of the node remains substantially unchanged after the switch opens, the current from the current source need not substantially charge or discharge this inherent capacitance when the switch subsequently closes in order to permit a transistor of the emitter-coupled pair to turn on.

13 Claims, 1 Drawing Sheet

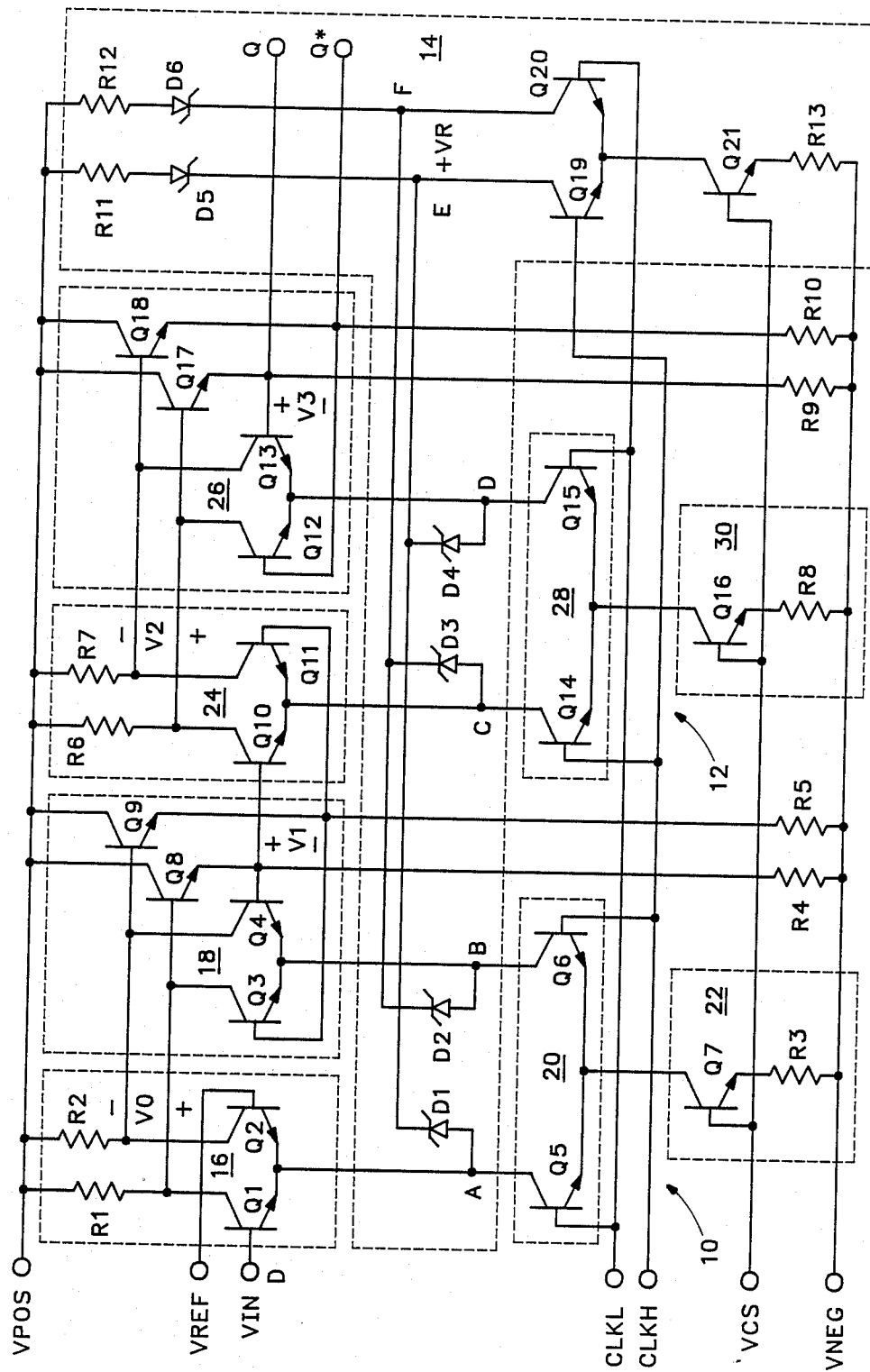

MULTILEVEL LOGIC CIRCUIT WITH FLOATING NODE VOLTAGE CLAMP

BACKGROUND OF THE INVENTION

The present invention relates in general to multilevel logic circuits and in particular to an improved multilevel logic circuit utilizing a voltage clamp to minimize voltage changes on floating nodes.

A multilevel transistor logic circuit selectively connects a current source to a voltage source through a load resistor and a series of switches so that current from the current source passes through the load resistor only if all of the switches are closed. A commonly employed two-level logic circuit comprises an emitter-coupled npn transistor pair having collectors coupled through load resistors to a voltage source and emitters selectively connected to a current source through a switch. An input signal is applied to the base of a first transistor of the pair and a reference signal is applied to the base of the second transistor of the pair. A clock signal controls switch operation. When, for example, the clock signal is high, the switch is closed and the input signal is at high logic level, an output voltage signal appearing between the collectors of the first and second transistors is negative. When the input signal swings low the output voltage swings positive. When the clock signal goes low, the switch opens, both transistors turn off and the output signal is unaffected by the input signal.

Such a logic circuit is useful, for example, as a buffer stage for a latch circuit having a regenerative latching output stage that operates when the clock signal goes low, the output signal produced by the buffer stage being applied as input to the latching output stage. When the clock signal is high, the polarity of the buffer stage output signal is determined by the magnitude of its input signal. When the clock signal goes low, the output stage latches the output of the buffer to its current state as of the falling edge of the clock signal.

In some applications it is desirable that a latch hold its state for a long time and then respond quickly to a short clock pulse that closes the switch only briefly. During the time that the clock signal is low, the switch is open and the emitters of the transistor pair of the buffer stage constitute a "floating node" that is no longer coupled to the voltage source because both transistors of the emitter-coupled pair are off. However, leakage current through the transistor pair charges inherent circuit capacitance at the node and eventually causes the voltage of the floating node to rise up to the source voltage. When the clock signal goes high again so as to close the switch, the current source must remove built-up charge from this inherent circuit capacitance before the voltage of the floating node can be reduced to a level sufficient to permit the first or second transistor to turn on. Thus, in order for the latch output to properly respond to the input signal, the clock signal must remain high to keep the switch closed for a minimum amount of time to allow for discharge of capacitance at the floating node, and that minimum amount of time increases with the duration of the low portion of the clock signal.

SUMMARY OF THE INVENTION

A multilevel logic circuit comprises two load resistors, an emitter-coupled pair of transistors, a switch, a voltage source, a current source and a voltage clamping circuit. The load resistors separately couple the collector of each transistor to the voltage source, and the switch selectively connects the emitters of the transistor pair to the current source in response to a control signal. When the switch is closed, current from the current source passes through the switch to the emitters of the two transistors. An input signal applied across the bases of the two transistors turns on one of the transistors while the other transistor remains off, thereby to control an output voltage developed between the collectors of the two transistors. In accordance with the invention, the voltage clamping circuit, connected to a node formed by the emitters of the two transistors, applies a constant voltage to the node when the switch is open, the constant voltage being approximately equal to the steady-state voltage of the node when the switch is closed. The clamping circuit prevents leakage current from charging or discharging inherent circuit capacitance at the node when the switch is open. Since the voltage of the node remains substantially unchanged when the transistors turn off, the current from the current source need not substantially charge or discharge this inherent capacitance after the switch closes before a transistor of the emitter-coupled pair can turn on.

It is accordingly an object of the invention to provide an improved multilevel logic circuit that provides high speed response to a change in level of a low frequency control signal.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawing. wherein like reference characters refer to like elements.

BRIEF DESCRIPTION OF THE DRAWING

The single drawing is a schematic diagram of a flip-flop circuit illustrating a preferred embodiment of the present invention.

DESCRIPTION OF THE PREFERRED EMBODIMENT

With reference to the single drawing, a type D flip-flop comprises an input latch stage 10, an output latch stage 12 and a clamping circuit 14. Input latch stage 10 includes an input buffer 16, a regenerative latch 18, a switch 20, and a current source 22. Buffer 16 includes a pair of npn transistors Q1 and Q2 having collectors respectively coupled to a positive voltage source VPOS through a pair of resistors R1 and R2. Regenerative circuit 18 includes a pair of npn transistors Q3 and Q4 having collectors connected to the collectors of transistors Q1 and Q2, respectively. Switch 20 comprises a pair of npn transistors Q5 and Q6, the collector of transistor Q5 being connected to the emitters of transistors Q1 and Q2, and the collector of transistor Q6 being connected to the emitters of transistors Q3 and Q4. An npn transistor Q7 and a resistor R3 form current source 22, the collector of transistor Q7 being tied to the emitters of transistors Q5 and Q6 and the emitter of transistor Q7 being coupled through resistor R3 to a negative voltage source VNEG. Regenerative circuit 18 further includes a pair of npn transistors Q8 and Q9 having collectors tied to voltage source VPOS, bases tied to the collectors of transistors Q3 and Q4, respectively, and emitters coupled to voltage source VNEG through resistors R4 and R5, respectively. The emitters of transistors Q8 and Q9, also connected to the bases of transistors Q4 and Q3, respectively, provide a first differential output signal V1 that is supplied as input to output latch stage 12.

The base of transistor Q1 provides the "D" input of the flip-flop for receiving an input signal VIN. A reference signal VREF is applied to the base of transistor Q2. VREF is a constant reference voltage but input signal VIN may vary with time and may be higher or lower in magnitude than VREF. A clock signal CLKL and a clock signal CLKH are applied to the bases of transistors Q5 and Q6, respectively, and a control signal VCS is applied to the base of transistor Q7. Clock signals CLKL and CLKH are of opposite phase such that when clock signal CLKL is high, clock signal CLKH is low, and when clock signal CLKH is high, clock signal CLKL is low.

Transistor Q5 of switch 20 and input latch stage 16 form a multiple level logic circuit that produces a differential output signal V0 across the collectors of transistors Q1 and Q2, output signal V0 being of magnitude that is a function of the levels of input signal VIN, clock signal CLKL and clock signal CLKH. If input signal VIN is higher in voltage than VREF, clock signal CLKL is high and clock signal CLKH is low, then transistors Q1 and Q5 are on and transistors Q2–Q4 and Q6 are off. Voltage source VPOS pulls the collector of transistor Q2 up while current from current source 22, directed through transistors Q5 and Q1 and resistor R1, pulls the voltage of the collector of transistor Q1 below the voltage of the collector of transistor Q2. Thus output signal V0 is negative. If input signal VIN swings lower in voltage than VREF, while clock signal CLKL is high and clock signal CLKH is low, then transistor Q1 turns off, transistor Q2 turns on and output signal V0 swings positive. (It should be understood that a single differential input signal could be applied across the bases of Q1 and Q2 in place of VIN and VREF, and in such case V1 changes polarity when the input signal changes polarity.)

When clock signal CLKL goes low and clock signal CLKH goes high, transistors Q1, Q2 and Q5 all turn off and input signal VIN no longer influences output signal V0. However, transistor Q6 turns on and supplies current to the emitters of transistors Q3 and Q4. If output signal V0 is positive on the rising edge of clock signal CLKH, then transistors Q3, Q4, Q8 and Q9 operate with positive feedback to latch a positive output signal V1 across the emitters of transistors Q8 and Q9. Conversely, if output signal V0 is negative on the rising edge of clock signal CLKH, then transistors Q3, Q4, Q8 and Q9 operate with positive feedback to latch output signal V1 negative. When clock signal CLKL is again driven high, and clock signal CLKH is driven low, the input signal VIN resumes control of output signal V0 via transistor Q1 and transistor Q2.

Thus, when clock signal CLKL is high and clock signal CLKH is low, the polarity of output signal V1 is determined by the magnitude of input signal VIN in relation to VREF. As clock signal CLKL goes low and clock signal CLKH goes high, latch 18 latches signal V0 to its current polarity and output signal V0 remains unaffected by input signal VIN until such time as clock signal CLKL goes high and clock signal CLKH goes low once again. Since transistors Q8 and Q9 are emitter follower amplifiers, the output signal V1 is substantially equal to V0 at all times and is therefore also controlled by input signal VIN when clock signal CLKL is high and clock signal CLKH is low.

Output latch stage 12 is similar to input latch stage 10 and includes an input buffer 24, a regenerative latch 26, a switch 28, and a current source 30. Buffer 24 includes a pair of transistors Q10 and Q11 having collectors respectively coupled to voltage source VPOS through a pair of resistors R6 and R7. Regenerative latch 26 includes a pair of transistors Q12 and Q13 having collectors connected to the collectors of transistors Q10 and Q11, respectively. A pair of switching transistors Q14 and Q15 form switch 28, the collector of transistor Q14 being tied to the emitters of transistors Q10 and Q11, and the collector of transistor Q15 being tied to the emitters of transistors Q12 and Q13. A transistor Q16 and a resistor R8 form current source 30, the collector of transistor Q16 being connected to the emitters of transistors Q14 and Q15 and the emitter of transistor Q16 being coupled through resistor R8 to the negative voltage source VNEG. Regenerative latch 26 also includes a pair of transistors Q17 and Q18 having collectors connected to voltage source VPOS, bases tied to the collectors of transistors Q10 and Q11, respectively, and emitters coupled to voltage source VNEG through resistors R9 and R10, respectively. The emitters of transistors Q17 and Q18, also connected to the bases of transistors Q13 and Q12, respectively, supply a differential output signal V3 that provides single-ended Q and Q* outputs of the flip-flop.

The output signal V1 of input latch stage 10 is applied across the bases of transistors Q10 and Q11 as an input signal to buffer 24. Clock signal CLKH and clock signal CLKL drive the bases of transistors Q14 and Q15, respectively, and control signal VCS controls the base of Q16. Transistors Q10, Q11, and Q14 form a two level logic circuit that produces a differential output signal V2 across the collectors of transistors Q10 and Q11. If input signal V1 is positive when clock signal CLKH is high and clock signal CLKL is low, then transistors Q10 and Q14 are on and transistors Q11–Q13 and Q15 are off. Voltage source VPOS pulls the collector of transistor Q11 up while current from current source 30, directed through transistors Q14 and Q10 and resistor R6, pulls the voltage of the collector of transistor Q10 below the voltage of the collector of transistor Q11. Thus output signal V2 is negative. If input signal V1 is negative while clock signal CLKL is low and clock signal CLKH is high, then transistor Q10 is off, transistor Q11 is on, and buffer 24 output signal V2 is positive.

When clock signal CLKH is low, transistors Q10, Q11 and Q14 turn off and buffer 24 input signal V1 no longer controls output signal V2. When clock signal CLKH goes low, clock signal CLKL goes high, thereby turning on transistor Q15. If output signal V2 is positive on the rising edge of clock signal CLKL then transistors Q12, Q13, Q17 and Q18 operate to latch output voltage V3 to a positive level in a regenerative fashion. On the other hand, when output signal V2 is negative on the rising edge of clock signal CLKL, then transistors Q12, Q13, Q17 and Q18 operate to latch voltage V3 to a negative level. When clock signal CLKH is again driven high, and clock signal CLKL is driven low, input signal V1 resumes control of output signal V2 via transistors Q10 and Q11, and transistors Q11, Q12 and Q15 turn off.

Thus, when clock signal CLKL is high and clock signal CLKH is low, the input latch stage 10 sets the polarity its output signal V1 in accordance with the level of input signal VIN with respect to VREF. As clock signal CLKL goes low and clock signal CLKH goes high, the input latch stage 10 latches its output signal V1 to its positive or negative state and output latch stage 12 causes its output signal V3 to follow its input signal V1. When clock signal CLKL goes high and clock signal CLKH goes low again, output latch stage 12 latches its output signal V3 to its current state. Hence, the magnitude of input signal VIN at the falling edge of clock signal CLKL determines the polarity of the output signal V3 during the remainder of the clock cycle.

In accordance with the invention, clamping circuit 14 is provided to maintain a constant voltage on a set of circuit nodes A–D at the collectors of corresponding transistors Q5, Q6, Q14 and Q15, respectively, which nodes would otherwise begin to float to the voltage of source VPOS when the transistors to which they are connected are turned off. For example, if clamping circuit 14 were not connected to node A, then when transistor Q5 turns off, leakage current through transistors Q1 and Q2 charges inherent circuit capacitance at node A and eventually causes the voltage of node A to float up to the voltage of source VPOS. When clock signal CLKL subsequently is driven high to turn on transistor Q5, the charge built up in that inherent capacitance must be discharged before either transistor Q1 or transistor Q2 can turn on.

If the circuit operates at a relatively high frequency, clock signal CLKL is driven low only for a relatively short time during each of its cycles, and the leakage current through transistors Q1 and Q2 does not have an opportunity to substantially charge the circuit capacitance at node A. Consequently transistor Q1 or Q2 turns on quickly after clock signal CLKL is driven high. However, if the circuit operates at a low frequency with clock signal CLKL being driven low for long periods of time, node A floats up to the voltage of source VPOS and the current from source 22 takes a relatively long time to discharge capacitance at node A before transistor Q1 or Q2 can turn on after clock signal CLKL is driven high. Thus, clock signal CLKL must remain high for a relatively long period of time in order to ensure that transistors Q1 and Q2 have an opportunity to correctly set the polarity of output signal V0 in response to input signal VIN. Therefore, without clamping circuit 14, the latch will not properly operate when the clock signal CLKL has a low frequency and a low duty cycle whereby it is low for long periods of time and high only briefly. Without clamp 14, nodes B–D also float in a manner similar to node A.

Clamping circuit 14 comprises a set of Schottky diodes D1–D6, three transistors Q19–Q21 and three resistors R11–R13. The collector of transistor Q19 (node E) is coupled through diode D1 to node A, through diode D4 to node D, and through diode D5 and resistor R11 to voltage source VPOS. Similarly, the collector of transistor Q20 (node F) is coupled through diode D2 to node B, through diode D3 to node C, and through diode D6 and resistor R12 to voltage source VPOS. The emitters of transistors Q19 and Q20 are tied to the collector of transistor Q21, and the emitter of transistor Q21 is coupled through resistor R13 to voltage source VNEG. Clock signals CLKH and CLKL are applied to the bases of transistors Q19 and Q20, respectively, and control signal VCS is applied to the base of transistor Q21. Resistor R13 has resistance similar to that of resistors R3 and R8. Likewise resistors R11 and R12 are similar to resistors R1, R2, R6, and R7. Transistor 21 is similar to transistors Q7 and Q16 while transistors Q19 and Q20 are similar to transistors Q5, Q6, Q14, and Q15.

Transistor Q21 and resistor R13 form a current source that provides a collector current in transistor Q21 similar in magnitude to the currents provided by current sources 22 and 30. Note that since resistor R11 is similar to resistors R1 and R2, a reference voltage VR produced at node E when transistor Q19 is on is substantially constant and approximately 0.3 volts (i.e., the forward bias voltage of diode D5) less than the steady-state voltage of node A when transistor Q5 and either one transistors Q1 or Q2 is on. When clock signal CLKH goes high and clock signal CLKL goes low, transistor Q19 turns on and transistor Q5 turns off. When transistor Q5 turns off, diode D1 acts like a switch to selectively couple node E to node A, and clamp 14 acts like a voltage source to provide a constant voltage (VR+0.3 volts) at node E. Since the magnitude of the constant voltage provided at node A is equal to the voltage produced at node A when transistor Q5 is on, node A is prevented from floating upward in voltage when transistor Q5 is off.

Thus, when transistor Q5 turns off, transistor Q19 turns on, the voltage at node E falls to approximately 0.3 volts less than the voltage at node A, and diode D1 becomes forward biased. While clock signal CLKL remains low, leakage current through transistors Q1 or Q2 passes through diode D1 and transistor Q19 and does not cause any increase in voltage at node A. Accordingly, as transistor Q5 turns off, node A is clamped to its current voltage and does not float.

When clock signal CLKL is subsequently driven high, and clock signal CLKH is driven low, transistor Q5 turns on and transistor Q19 turns off. Voltage source VPOS pulls up the reference voltage VR at node E so that diode D1 becomes reverse biased, thereby uncoupling node E from node A. Since node A is already substantially at the voltage required to permit transistor Q1 or Q2 to turn on after transistor Q5 turns on, there is no need to substantially discharge capacitance at node A before either transistor Q1 or Q2 does in fact turn on. Thus, buffer 16 responds quickly when clock signal CLKL is driven high, even after clock signal CLKL has been held low for a long time.

In a similar manner diode D4 selectively couples node D to node E so as to prevent node D from floating to the voltage of source VPOS after transistor Q15 turns off. The clamping circuit also operates to prevent nodes B and C from floating. When CLKH is high, a reference voltage produced at node F is approximately 0.3 volts less than the steady-state voltage at nodes B and C when CLKL is low. Thus, when CLKH goes high, diodes D2 and D3 act like switches to couple nodes B and C to node F so that when transistors Q6 and Q14 turn off, nodes B and C cannot float up. Therefore, the clamping circuit allows the flop-flop to operate properly at low clock frequencies when either clock signal CLKL or CLKH is low for long periods of time and high only briefly.

While the invention has been illustrated as an improvement to a flip-flop circuit, it will be appreciated that invention may be utilized in other applications employing multilevel logic circuits that may have one or more floating nodes. A multilevel logic circuit selectively connects a current source (e.g. source 22) to a voltage source (e.g. voltage source VPOS) through a load resistor (e.g. resistor R1) and two or more levels of switches that may comprise switching transistors (e.g. transistors Q1 and Q2 as a first level, and transistor Q5 as a second level). In accordance with the invention, such a multilevel logic circuit is improved by connecting a voltage clamp (such as clamp 14) to each floating node (e.g. node A) at a point of interconnection between switch levels, the clamp preventing the node from floating to the voltage of the voltage source after the switching transistors turn off.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. In a buffer circuit comprising a switch and at least one transistor having a control terminal for receiving an input signal, a first load terminal resistively coupled to a voltage source, and a second load terminal, the switch alternatively coupling a current source to and uncoupling the current source from the second load terminal in response to a control signal, the improvement comprising clamping means responsive to said control signal for maintaining a substantially constant voltage at said second load terminal while the switch decouples the current source from the second load terminal, the constant voltage being substantially equal to a steady-state voltage produced at said second load terminal when the switch couples the current source to the second load terminal.

2. A circuit for selectively buffering an input signal in response to a control signal, the circuit comprising:
   a current source;
   buffer means for producing an output signal in response to the input signal when the current source is coupled to a first node of the buffer means; and
   means responsive to the control signal for selectively coupling the first node to the current source when the control signal is of a first level, for uncoupling the first node from the current source when the control signal is of a second level, and for maintaining a constant voltage on the first node when the control signal is of the second level.

3. The circuit in accordance with claim 1 wherein the constant voltage is substantially equal to a steady-state voltage produced at the first node when the current source is connected to the first node.

4. The circuit in accordance with claim 1 wherein the means responsive to the control signal comprises:
   switch means for selectively coupling the first node to the current source when the control signal is of the first level;
   means for producing at a second node a reference voltage of a third level when the control signal is of the first level, and for producing the reference voltage of a fourth level when the control signal is of the second level; and
   a diode connected between the first and second nodes, the diode being reverse biased when the reference voltage is of the second level and forward biased when the reference voltage is of the fourth level.

5. The circuit in accordance with claim 4 wherein the fourth level of the reference voltage differs from a steady-state voltage produced at the first node when the current source is connected to the first node, the reference voltage and steady-state voltages differing by an amount approximately equal to a forward bias voltage of the diode.

6. The circuit in accordance with claim 2 wherein said buffer means comprises:
   a load resistor;
   a source of supply voltage; and
   at least one transistor having a control terminal for receiving the input signal and having first and second load terminals, the load resistor coupling the first load terminal of the first transistor to the source of supply voltage, the second load terminal of the first transistor being coupled to the first node.

7. The circuit in accordance with claim 6 wherein said means responsive to the control signal comprises:
   switch means for selectively coupling the first node to the current source when the control signal is of the first level;
   means for producing at a second node a reference voltage of a third level when the control signal is of the first level and for producing the reference voltage of a fourth level when the control signal is of the second level; and
   a diode connected between the first and second nodes, the diode being reverse biased when the reference voltage is of the second level and forward biased when the reference voltage is of the fourth level.

8. The circuit in accordance with claim 7 wherein the switch means comprises a second transistor having a control terminal for receiving the control signal, having a first load terminal coupled to the first node and having a second load terminal coupled to the current source.

9. A multilevel logic circuit for selectively buffering an input signal in response to a control signal, the logic circuit comprising:
   first current source means for producing a substantially constant current;
   a first load resistor;
   a second load resistor;
   a source of supply voltage;
   a first transistor having a control terminal and first and second load terminals;
   a second transistor having a control terminal and first and second load terminals, the first and second load resistors respectively coupling the first load terminals of the first and second transistors to the source of supply voltage, the second load terminals of the first and second transistors being coupled one to another, the input signal being applied across the control terminals of the first and second transistors;
   a circuit node;
   second current source means connected to the circuit node for selectively providing a current through the circuit node in response to the control signal;
   a third load resistor;
   a first diode, the first diode and the third load resistor being connected in series between the source of supply voltage and the circuit node;
   a second diode coupling the second load terminals of the first and second transistors to the circuit node; and
   means for selectively connecting the first current source means to the second load terminals of the first and second transistors in response to the control signal.

10. A multilevel logic circuit comprising:
   a circuit node;
   a current source;
   a source of supply voltage;
   a load resistor;
   a first transistor, having a control terminal for receiving an input signal and having first and second load terminals, the load resistor coupling the first load terminal of the first transistor to the source of supply voltage, the second load terminal of the first transistor being coupled to the circuit node;
   a second transistor, having a control terminal for receiving a control signal and having first and second load terminals, the first load terminal of the second transistor being coupled to the circuit node, the second load terminal of the second transistor being coupled to the current source, the second transistor providing a path of low impedance between its first and second load terminals when the control signal is of a first level and providing a high impedance path between its first and second load terminals when the control signal is of a second level; and
   clamping means responsive to the control signal for selectively clamping the circuit node to a constant voltage when the control signal is of the second level.

11. The circuit of claim 10 wherein the clamping means comprises;
   a source of the reference voltage, the reference voltage being of magnitude determined by the control signal; and
   diode means connecting the source of reference voltage to the circuit node, the reference voltage being of magnitude such that the diode is forward biased when the control signal is of the second level and reverse biased when the control signal is of the first level.

12. A latch comprising:
   a current source for providing a control current;
   a buffer having a first circuit node for receiving said control current and producing as output a first differential signal in response to an input differential signal when said control current is applied to said first circuit node;
   a regenerative circuit having a second circuit node for receiving said control current and producing as output a second differential signal in response to said first differential signal when said control current is applied to said second circuit node;
   switch means for alternatively applying said control current to said first and second circuit nodes in accordance with a control signal; and
   clamping means responsive to said control signal for maintaining said first circuit node at a first constant voltage when the control current is applied to said second circuit node and for maintaining said second circuit node at a second constant voltage when said control current is applied to said first circuit node.

13. The latch in accordance with claim 12 wherein said first constant voltage is substantially equal to a first steady-state voltage produced at said first circuit node when said control current is applied to said first circuit node, and wherein said second constant voltage is substantially equal to a second steady-state voltage produced at said second circuit node when said control current is applied to said second circuit node.

* * * * *